(12) United States Patent
Yoon

(10) Patent No.: US 7,494,833 B2
(45) Date of Patent: Feb. 24, 2009

(54) APPARATUS FOR STACKING CASSETTE AND A METHOD OF FABRICATING A LIQUID CRYSTAL DISPLAY DEVICE USING THE SAME

(75) Inventor: Sung Hwan Yoon, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 241 days.

(21) Appl. No.: 11/312,693

(22) Filed: Dec. 21, 2005

(65) Prior Publication Data

US 2006/0286700 A1    Dec. 21, 2006

(30) Foreign Application Priority Data

Jun. 20, 2005   (KR) ...................... 10-2005-0053191

(51) Int. Cl.
H01L 21/20 (2006.01)
(52) U.S. Cl. ........................................................ 438/30
(58) Field of Classification Search .................. 438/30, 438/166, 458–465; 414/217, 935–940
See application file for complete search history.

(56) References Cited

U.S. PATENT DOCUMENTS 6,999,154 B2 * 2/2006 Choo et al. ................. 349/192

2004/0216672 A1 * 11/2004 Ishii et al. .................... 118/719
2004/0259326 A1 * 12/2004 Hideo ......................... 438/458

FOREIGN PATENT DOCUMENTS

| CN | 1590252 A | 3/2005 |
|---|---|---|
| DE | 3937252 A1 | 5/1991 |
| DE | 19815151 | 2/1999 |
| DE | 10296988 T5 | 6/2006 |
| JP | 3192005 | 8/1991 |
| JP | 6183513 | 7/1994 |
| JP | 2000002909 | 1/2000 |
| JP | 2000203702 | 7/2000 |
| JP | 2002343846 | 11/2002 |
| KR | 10-2005-0022246 | 3/2005 |

* cited by examiner

Primary Examiner—Savitri Mulpuri
(74) Attorney, Agent, or Firm—McKenna Long & Aldridge, LLP

(57) ABSTRACT

A cassette stacking apparatus is provided. The cassette stacking apparatus includes a first loading unit that loads or unloads a cassette. The cassette stacking apparatus also has a stacking unit disposed at a side of the loading unit, wherein an upper portion of the stacking unit forms a shelf which receives the cassette.

6 Claims, 3 Drawing Sheets

APPARATUS FOR STACKING CASSETTE AND A METHOD OF FABRICATING A LIQUID CRYSTAL DISPLAY DEVICE USING THE SAME

This application claims the benefit of Korean Patent Application No. 10-2005-0053191, filed on Jun. 20, 2005, which is hereby incorporated by reference for all purposes as if fully set forth herein.

BACKGROUND OF THE INVENTION

1. Field of the Invention

The present invention relates to an apparatus for stacking a cassette, and more particularly, to an apparatus which temporarily stacks a cassette which holds glass that is part of a liquid crystal display (LCD) device in order to perform various processes while moving the cassette between the processes, and a method of fabricating an LCD device using the same.

2. Description of the Related Art

The demand for information displays and portable information media is growing everyday. In response to this demand, research and commercialization efforts have been directed toward light and thin flat panel display (FPD) devices which replace a cathode ray tube (CRT) that are currently used for various display devices. Particularly, of the FPD devices, a liquid crystal display (LCD) device displays an image using the optical anisotropy of liquid crystals. Displays having LCD devices have excellent resolution, color display and image quality. As a result, LCD devices are used in many applications, such as notebook computers, desktop monitors and the like.

A LCD device will now be described in further detail. A LCD device includes a LCD panel having a driving circuit unit, a back light unit behind the LCD panel that emits light to the LCD panel, a mold frame and a case that supports the back light unit and the LCD panel.

The LCD panel includes a color filter substrate, an array substrate and a liquid crystal layer formed between the color filter substrate and the array substrate.

The color filter substrate includes a color filter having red, green, and blue (R, G and B) sub color filters for implementing colors. The color filter substrate also has a black matrix formed between the sub color filters that blocks light transmitted through the liquid crystal layer. Additionally, the color filter substrate has a transparent common electrode that applies a voltage to the liquid crystal layer.

The array substrate includes a plurality of gate lines arranged lengthwise on the substrate and a plurality of data lines arranged widthwise on the substrate. The plurality of gate lines and data lines form a plurality of pixel regions. Thin film transistors (TFTs), which are switching devices, are formed at intersections of the gate lines and the data lines. In addition, pixel electrodes are formed on the pixel regions.

The LCD panel is formed by attaching the array substrate and the color filter substrate with a sealant at an outer edge of an image display region. Here, the array substrate and the color filter substrate face each other. The two substrates are attached to each other with an attachment key formed on either the array substrate or the color filter substrate.

The process of fabricating the LCD panel may be divided into an array process for forming a switching device on the array substrate, a color filter process for forming a color filter on the color filter substrate and a cell process. When a LCD panel is fabricated, the LCD must be fabricated in an area which is very clean. In order to maintain cleanliness, substrates used in the fabrication of LCD panels are moved in a cassette between processes. In addition, the substrates may also be stored within a stocker for temporary storage.

FIG. 1 is a schematic sectional view that illustrates a structure of a general stocker 10.

As shown, a stocker body 15 has a box shape and a path 16 formed therein where the path 16 is in a vertical direction relative to the stocker 10. The stocker 10 includes a plurality of shelves 40 on which cassettes 30 for receiving substrates are loaded. The shelves 40 are disposed on both sides of the path 16.

A stacker 20 is installed at the path 16 which loads the cassette 30 on the shelf 40 or draws the cassette 30 from the shelf 40 for conveyance. Also, the stacker 20 includes driving units 21 and 22 which drive the stacker 20 and convey the cassette 30.

A robot arm 23 is installed at the stacker 20 for conveying the cassette 30 to each process step by loading or unloading it.

A plurality of fan filter units (FFUs) (not shown) for purifying the air and supplying the purified air into the stocker body 15 are installed on a ceiling of the stocker body 15. The FFUs are also at a ceiling of the path 16. In addition, an air introduction control shutter (not shown) for controlling the amount of air introduced into the stocker body 15 is installed at a rear side of the shelf 40.

Reference numeral 50 indicates an access floor of a clean room where the stocker 10 is installed. Reference numeral 60 indicates a loader upon which the stacker 20 loads and unloads the cassette.

A frame of the stocker body 15 is formed with a metallic material. In order to accept the cassette 30, the shelf 40 is formed with the frame. However, the stocker body 15 requires a large amount of shelves 40. Accordingly, manufacturing costs associated with the stocker 10 greatly increase.

Furthermore, if a robot of the stacker 20 collides with the frame of the stocker body 15, the frame of the stocker body may deform. Thus, the stocker 10 must be taken offline in order to complete repairs.

SUMMARY OF THE INVENTION

Accordingly, the present invention is directed to an apparatus for a stacking cassette and a method of fabricating a liquid crystal display device using the same that substantially obviates one or more of the problems due to limitations and disadvantages of the related art.

An advantage of the present invention provides an apparatus for stacking a cassette which does not have a frame thereby lowering a cost associated with the apparatus and occupying less volume, and a fabricating method of an LCD device using the same.

To achieve these and other advantages and in accordance with a purpose of the present invention, as embodied and broadly described herein, there is provided a cassette stacking apparatus that includes at least one loading unit that loads or unloads a cassette, and a stacking unit. The stacking unit is disposed at a side of the loading unit. In addition, an upper portion of the stacking unit forms a shelf that receives the cassette.

In another aspect of the present inventoion a method of fabricating a LCD device includes holding a first substrate of the LCD device and a second substrate of the LCD device in a cassette of a cassette stacking apparatus, removing the cassette from the cassette stacking apparatus and removing the first substrate and the second substrate from the cassette. The method also involves performing an array process on the first substrate, performing a color filter process on the second substrate, and attaching the first and second substrates. In addition, the method cuts the attached substrates into a plurality of unit LCD panels. In this embodiment, the cassette stacking apparatus includes at least one loading unit that loads or unloads a cassette and a stacking unit. The stacking unit is disposed at a side of the loading unit where an upper portion of the stacking unit forms a shelf that receives the cassette. The cassette is removed from the shelf such that the array process and the color filter process may be performed on the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to embodiments of the present invention, examples of which are illustrated in the accompanying drawings.

Figure 1:
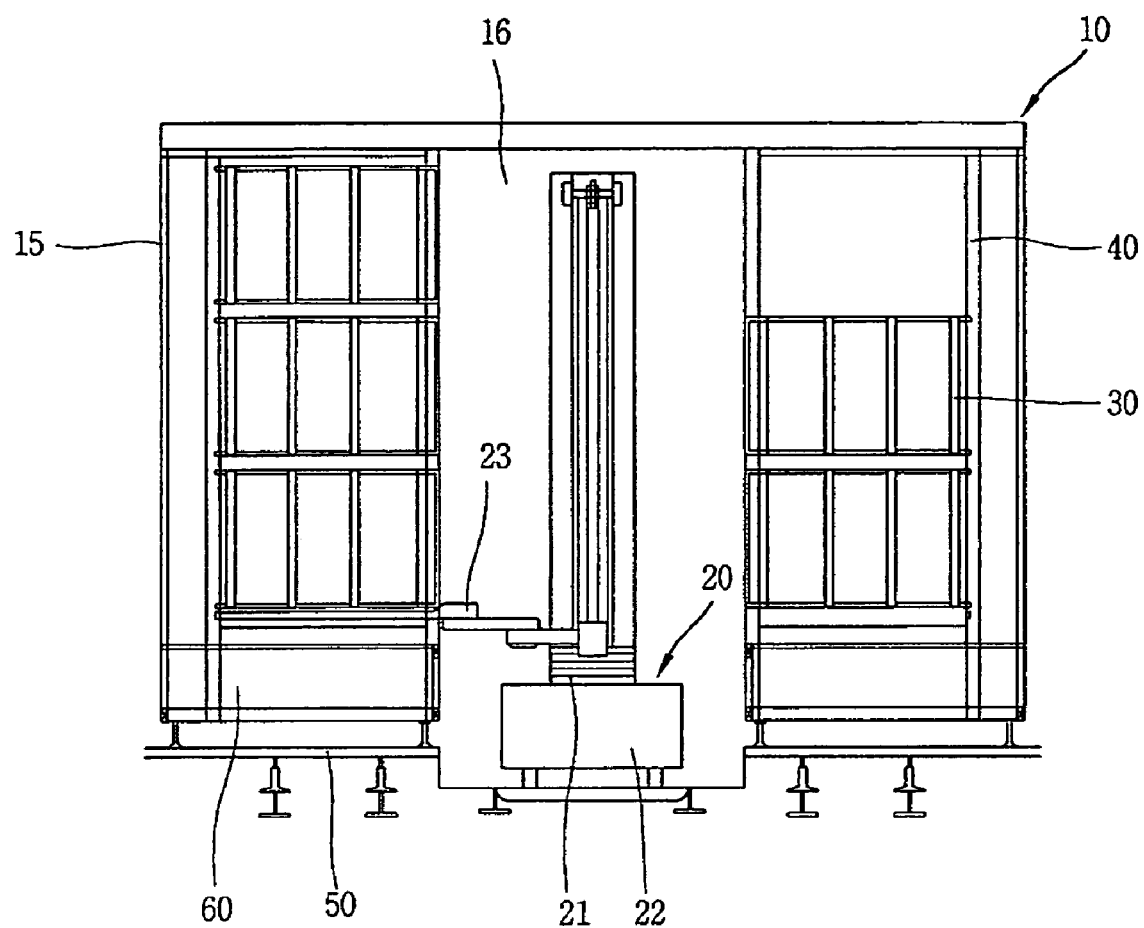
FIG. 1 illustrates a general stocker.
Figure 2:
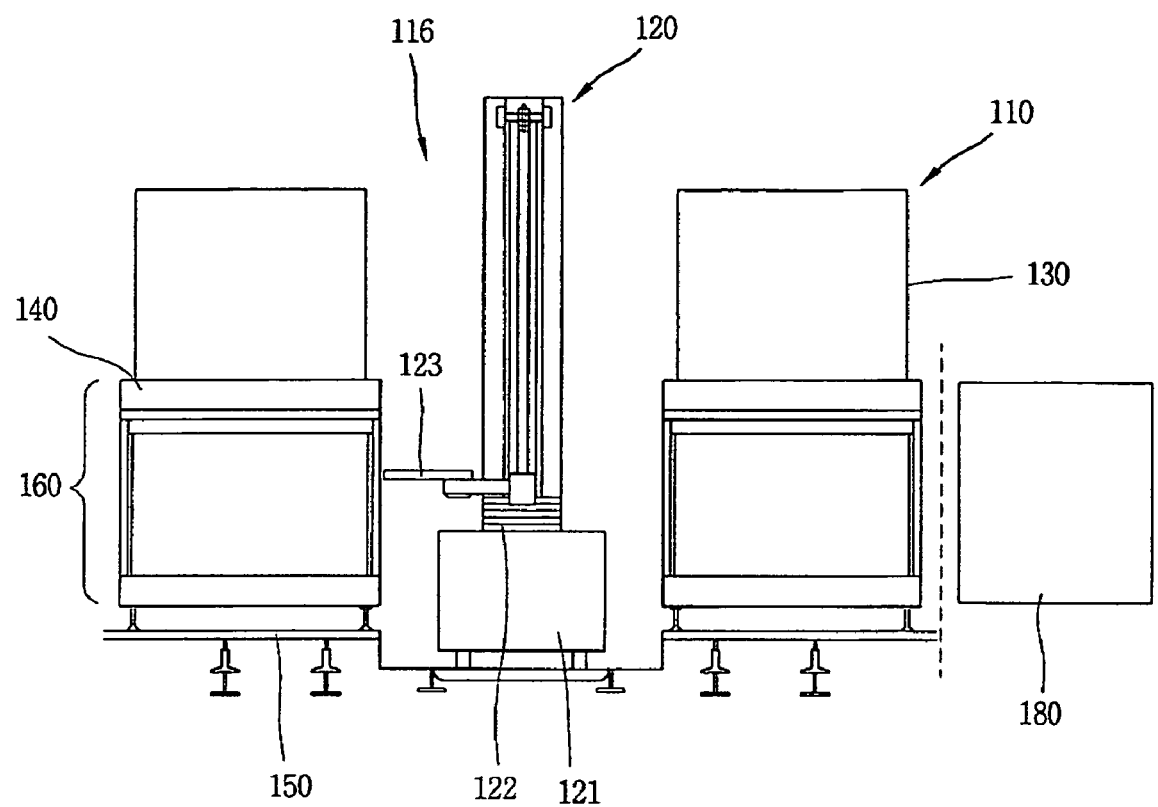
FIG. 2 a stocker in accordance with an embodiment of the present invention.
Figure 3:
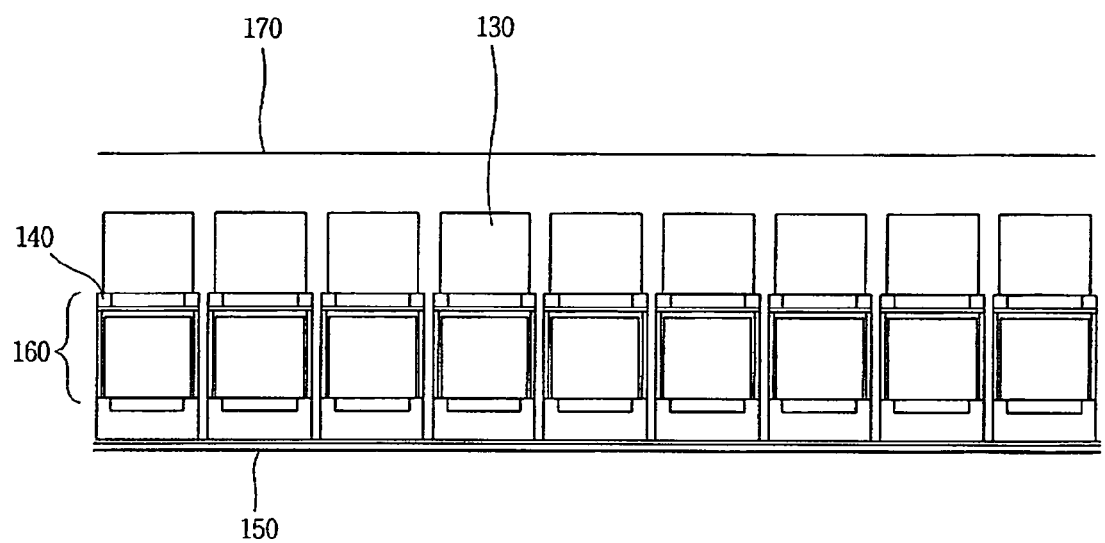
FIG. 3 is a side view of the stocker in accordance with an embodiment of the present invention.

FIG. 2 illustrates a structure of a cassette stacker 110 in accordance with an embodiment of the present invention, and FIG. 3 is a side view of the cassette stacker 110 in accordance with an embodiment of the present invention.

The cassette stacker 110 includes a stocker master controller (SMC) (not shown) that controls a system in the cassette stacker 110, a loading unit 120, for loading or unloading a cassette 130 upon receiving a control signal from the SMC, and a plurality of shelves 140 on which the cassettes, such as a cassette 130, are loaded, by the loading unit 120.

The cassette 130 receives components of a LCD display, such as glass, and is used to transport the components between fabrication processes. Cassettes vary according to the manufacturer, the size, and the characteristics of the glass. In some instances, the cassette may have a quadrangular box shape, and may receive a plurality of glasses in multi layers.

As may be seen in FIG. 2, the loading unit 120 moves along a path within the cassette stacker 110 generally defined by the reference numeral 116. As may be seen in the FIG. 2, the path 116 is generally disposed in a center portion of the cassette stacker 110. The loading unit 120, that is disposed in the center of the cassette stacker 110 moves along the path 116 to load or unload the cassette 130 from the shelf 140.

The loading unit 120 includes driving units 121 and 122 that drive the loading unit 120 and move the cassette 130. The driving units 121 and 122 allow for angular movement and rotation in the x-axis, y-axis and z-axis directions.

Furthermore, the loading unit 120 includes a robot arm 123 for conveying the cassette 130 to each process step. The robot arm 123 loads and unloads the cassette 130 from the loading unit 120. The robot arm 123 has a sensor (not shown) for checking whether or not there is a cassette 130 on the robot arm 123 prior to loading or unloading the cassette 130.

A loader 160 is disposed at a lower end of the shelf 140. The loader 160 functions as a stage of the shelf 140 such that the cassettes are loaded thereon. Here, a height of the loader 160 allows the driving units 121 and 122 of the loading unit 120 to load or unload the cassette 130. In one embodiment, the height of the loader 160 may be set according to the moving range of the robot arm 123 of the loading unit 120. For example, the loader 160 may be designed to have a height corresponding to a minimum height at which the robot arm 123 of the loading unit 120 operates.

Reference numeral 150 indicates an access floor of a clean room where the cassette stacker 110 is installed. In addition, reference numeral 170 indicates a ceiling of the clean room.

The cassette stacker 110 in accordance with the present invention utilizes an upper portion of the loader 160 as the shelf 140, thereby eliminating a need to design an outer edge of the shelf 140. The shelf 140 allows for loading of the cassette 130. In addition, the loader 160 provides the body of the cassette stacker 110 with a frame.

In this embodiment, the cassette stacker 110 does not have a frame. In this embodiment, an upper portion of the loader 160 is used as the shelf 140. More specifically, a frame that forms the body of the cassette stacker 110 and the outer edge of the shelf 140 is removed. Here, an upper portion of the loader 160 provides a stage of the shelf 140 for loading the glass thereon. In this embodiment, a structure having a configuration similar to the loader 160 is formed to load the cassette thereon.

A cassette structure in accordance with this embodiment that does not include a frame is half the size of a cassette structure having a frame. Thus, fabrication costs and times associated with this type of cassette structure are reduced. Approximately 50% of the fabrication time of a cassette stacker includes assembling the frame for the body of the cassette stacker and the shelf. Accordingly, more time may be devoted to fabricating LCD panels instead of the cassette stacker.

Also, during set-up, a robot of a loading unit does not collide with a frame of a cassette stacker formed in accordance with the present invention. Furthermore, when the cassette stacker is being used during the fabrication of LCD devices, if repairs are necessary at a specific area of the cassette stacker, the fabrication process is not stopped. Accordingly, the present invention increases the production yield of LCD devices fabricated in processes employing the present invention.

The cassette stacker 110 may have a cluster configuration such that processor equipment 180 may be disposed along a side of the cassette structure where multiple processor equipment may be lined up alongside the cassette structure 110. Accordingly, space within a clean room having the cassette structure 110 is maximized. In addition, a cassette stacker in accordance with the present invention increases the efficiency of a process which manufactures LCD devices.

Figure 4:
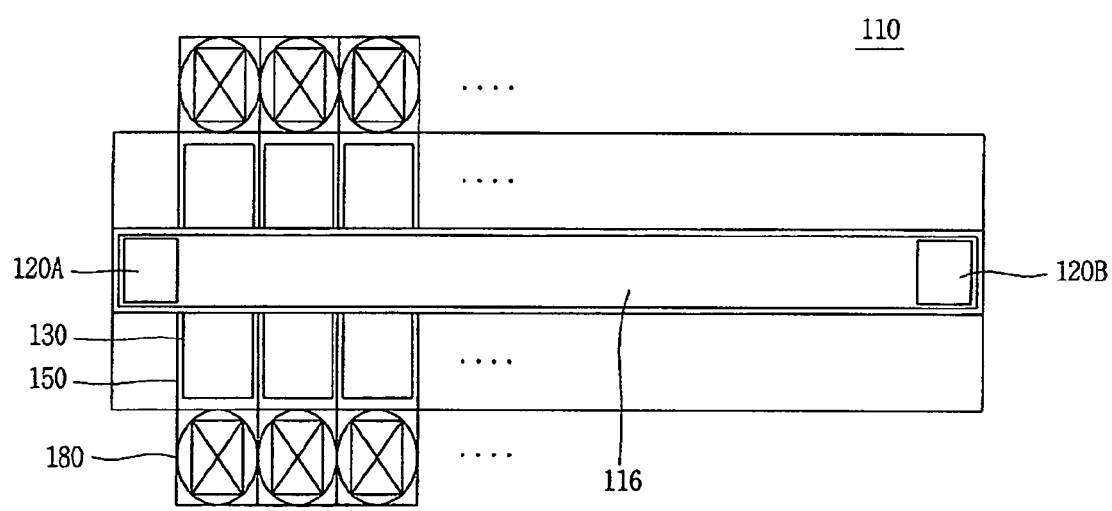
FIG. 4 is a top view of the stocker in accordance with an embodiment of the present invention.

FIG. 4 is a top view of the cassette stacker 110 in accordance with an embodiment of the present invention.

As may be seen in FIG. 4, the path 116 also extends within the cassette stacker 110 in a horizontal direction where loading units 120A and 120B are installed along the path 116 at front and rear portions of the path 116 and the cassette stacker 110. The loading units 120A and 120B load the cassette 130 onto the shelf of the upper portion of the loader 160 and unload the cassette 130 from the shelf. It should be noted that the loading units 120A and 120B may be disposed anywhere within the cassette stacker 110.

If the loading units 120A and 120B are installed at the front and rear of the path 116 as described above, should one of the loading units 120A or 120B require repair, a fabrication process using the cassette stacker 110 continues during repair of the loading unit.

A cassette temporarily stored or kept in the cassette stacker 110 is conveyed to the process equipment 180 by using a vehicle such as an AGV (Auto Guided Vehicle) or a MGV (Manual Guided Vehicle). In the present embodiment, as shown in FIG. 4, the process equipment 180 is disposed at the side of the cassette stacker 110 and the side of the loader 160. Accordingly, the present invention reduces the range within which the moving vehicle must move during a fabrication process. Furthermore, in some applications, the present invention does not require a moving vehicle during a fabrication process. Accordingly, the cassette stacker of the present invention minimizes space requirements of a clean room. Additionally, because the present invention minimizes the number of times a component needs to be handled, i.e., a vehicle does not convey a component, fabrication times of processes using the present invention decrease.

As described, the loader 160 utilizes an upper portion thereof as a shelf. Moreover, a portion of the cassette stacker 110 is formed to receive the cassette 130 during a fabrication process.

Also, conveying equipment such as a conveyer (not shown) may be used between the process equipment 180 and additional process equipment (not shown).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display (LCD) device, the method comprising:

holding a first substrate of the LCD device and a second substrate of the LCD device in a cassette of a cassette stacking apparatus;

removing the cassette from the cassette stacking apparatus;

removing the first substrate and the second substrate from the cassette;

performing an array process on the first substrate;

performing a color filter process on the second substrate;

attaching the first and second substrate together; and cutting the attached substrates into a plurality of unit LCD panels, wherein the cassette stacking apparatus includes first loading unit that loads or unloads a cassette, a plurality of stacking units disposed at a side of the loading unit where an upper portion of the stacking unit forms a shelf that receives the cassette where the cassette is removed from the shelf such that the array process and the color filter process may be performed on the first and second substrates and a plurality of process equipment for processing substrates disposed in the cassette, and wherein the plurality of process equipment and the plurality of stacking units have a cluster configuration such that the plurality of process equipment are disposed along a side of the plurality of stacking units.

2. The method of claim 1, wherein the loading unit further including a robot arm for conveying the cassette.

3. The method of claim 2, wherein the loading unit further including a driving unit that drives the robot arm and operates the loading unit.

4. The method of claim 2, wherein a height of the stacking unit allows operation of the robot arm.

5. The method of claim 1, wherein the cassette stacking apparatus further includes a second loading unit wherein the first loading unit and the second loading unit are formed at the front and rear of the cassette stacker.

6. The method of claim 5, wherein the second loading unit loads the cassette onto the cassette stacking apparatus when the first loading unit is non-functional.

* * * * *